United States Patent [19]

Kitamura

[11] 4,348,601
[45] Sep. 7, 1982

[54] BUFFER CIRCUIT
[75] Inventor: Yoshishige Kitamura, Tokyo, Japan
[73] Assignee: Nippon Electric Co., Ltd., Tokyo, Japan
[21] Appl. No.: 64,809
[22] Filed: Aug. 8, 1979
[51] Int. Cl.³ .............. G11C 7/06; G01R 19/165; H03K 5/24; H03K 5/08
[52] U.S. Cl. .................. 307/530; 307/562; 307/568; 365/103; 365/189
[58] Field of Search .......... 307/350, 362, 359, 237, 307/DIG. 3, 548, 554, 568, 530; 365/189, 191, 205, 103-104

[56] References Cited

U.S. PATENT DOCUMENTS

| | | | |
|---|---|---|---|
| 3,560,765 | 2/1971 | Kubinec | 307/DIG. 3 X |
| 3,648,071 | 3/1972 | Mrazek | 307/237 |
| 3,728,556 | 4/1973 | Arnell | 307/251 |
| 3,932,848 | 1/1976 | Porat | 307/DIG. 3 X |
| 4,039,860 | 8/1977 | Lambrechtse et al. | 307/DIG. 3 X |
| 4,124,808 | 11/1978 | Shieu et al. | 307/DIG. 3 X |
| 4,136,292 | 1/1979 | Suzuki et al. | 307/DIG. 3 X |

OTHER PUBLICATIONS

McKenny, *Electronics*, pp. 80-85, Feb. 12, 1971.

*Primary Examiner*—Larry N. Anagnos
*Attorney, Agent, or Firm*—Fitzpatrick, Cella, Harper & Scinto

[57] ABSTRACT

A buffer circuit operable with high speed is disclosed. The circuit comprises an input node, an amplifying means having an input coupled to the input node, a first power source, a second power source, a first transistor coupled between the first potential source and the input node, a second transistor coupled between the input node and the second power source, and means responsive to the output of the amplifying means for respectively providing a first signal and a second signal complementary to the first signal to the gates of the first and second transistors so as to restrict a potential amplitude at the input mode.

8 Claims, 5 Drawing Figures

BUFFER CIRCUIT

The present invention relates to a buffer circuit, and more particularly, to a buffer circuit adaptable for a sense circuit for sensing a read-out signal in a memory.

In a memory using insulated-gate field-effect transistors (hereinafter referred to as IGFETs), a sense node selectively coupled with a digit line of a memory array is charged through a pull-up transistor. When a specific digit line of the memory array is selected, a charge at the sense node is discharged in accordance with a binary state stored in a memory cell. A sense circuit coupled with the sense node detects the potential drop or discharge at the sense node, to thereby produce a signal representing a binary state stored in the cell.

One of such sense circuits is disclosed in U.S. Pat. No. 3,932,848 entitled "FEEDBACK CIRCUIT FOR ALLOWING RAPID CHARGING AND DISCHARGING OF A SENSE NODE IN A STATIC MEMORY". According to this patent, an IGFET is provided between a sense node and a power source $V_{DD}$ and is controlled by feedback means in accordance with the output from the sense circuit. In this way, the amplitude of the voltage at the sense node is restricted to facilitate the charge of the sense node. This approach, however, performs the discharge of the sense node only by the current path due to the memory cell so that it is impossible to shorten the discharge time. In this respect, this prior art approach represents a limit on the speed of access to the memory.

Accordingly, an object of the invention is to provide a buffer circuit operable at a high speed.

Another object of the invention is to provide a sense circuit allowing high speed read-out operations.

According to one aspect of the present invention a buffer circuit is provided comprising an input node, an amplifier having an input terminal connecting to the input node, a first control IGFET connected between the input node and a first power source, a second control IGFET connected between the input terminal and a second power source, and a feedback circuit connected between the output of the amplifier and the first and second control IGFETs for controlling a potential at the input node, whereby a voltage level at the input node is restricted by complementarily controlling the first and second control IGFETs.

According to another aspect of the present invention, there is provided a static memory comprising a sense node selectively coupled with a specific memory cell in the memory for sensing a state of the memory cell, a sense amplifier having an input terminal coupled to the sense node, a first IGFET connected between a first power source providing a high level and the sense node, a second control IGFET between the sense node and a second power source providing a low level, and a feedback circuit responsive to the output of the sense amplifier for complementarily controlling the first and second control IGFETs so as to restrict the change of a potential in the sense node. In this static memory, when a low level is read out onto the sense node, the feedback means renders the first control IGFET conductive, while, when a high level is read out thereonto, the feedback means renders the second control means conductive. With such a construction, the amplitude of the voltage at the sense node is restricted thereby facilitating the charging and discharging at the sense node.

According to still another aspect of the present invention, there is also provided an inverter circuit comprising an input node, an inverter supplied with an input from the input node, a first IGFET coupled between the input node and a first power source, and a second IGFET provided between the input node and a second power source, wherein the output of the inverter or a signal in same phase to the inverter output is supplied to the gate of the first IGFET and a signal oppositely related in phase to the inverter output is applied to the second IGFET, thereby to restrict the swing amplitude of the voltage at the input node. An inverter circuit with such a construction is well adaptable for a sense circuit.

Other objects and features of the invention will be apparent from the following description taken in connection with the accompanying drawings, in which.

Figure 1:
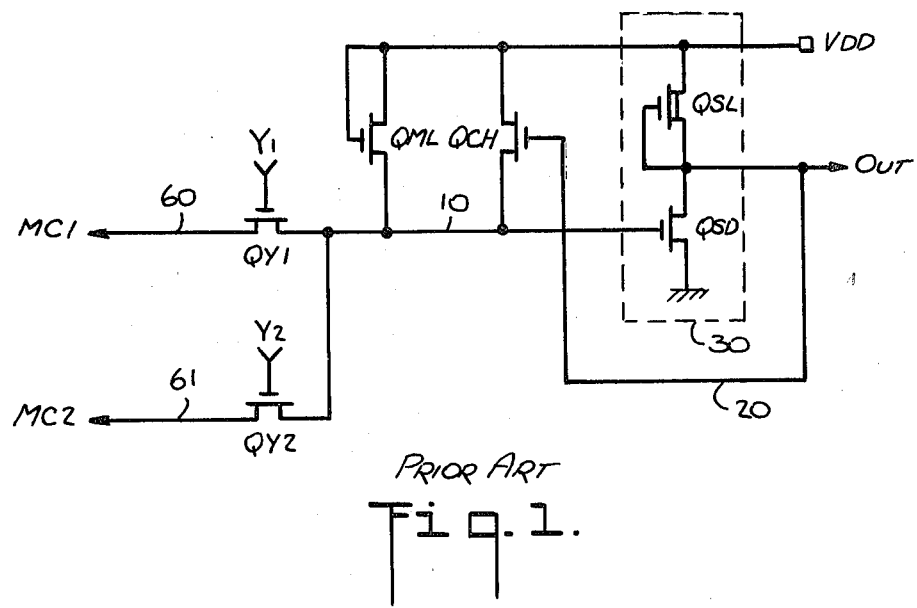
FIG. 1 shows a circuit diagram of a conventional sense circuit in a MOS static memory.

Referring now to FIG. 1, there is shown a prior art sense circuit used in a memory circuit described in the above-mentioned U.S. patent specification. In the circuit, a sense node 10 is coupled to a bit line 60 or 61, in turn coupled to a memory cell MC1 or MC2, respectively, through a Y-select IGFET QY1 or QY2 which is responsive to a Y-select signal Y1 or Y2, respectively. Between the sense node 10 and a power source VDD, an IGFET QML as a load element of a memory cell and an IGFET QCH to restrict the drop of a potential at the sense node 10 are connected in parallel. A read-out signal provided at the sense node 10 is amplified by a sense amplifier 30 and is outputted from the output OUT of the amplifier 30. The output signal has an opposite phase to the signal at the sense node 10. The output signal from the sense amplifier 30 is fed back to the gate of the IGFET QCH, through a feedback path 20.

With such a construction, the charging at the sense node 10 after the read-out operation is performed through the combination of the IGFET QML and the IGFET QCH so that the charging time is shorter than that in the case of the use of a single load IGFET QML. However, in the read-out operation, the discharging is performed through only one selected memory cell.

Therefore, the discharge time cannot be shortened.

Figure 2:
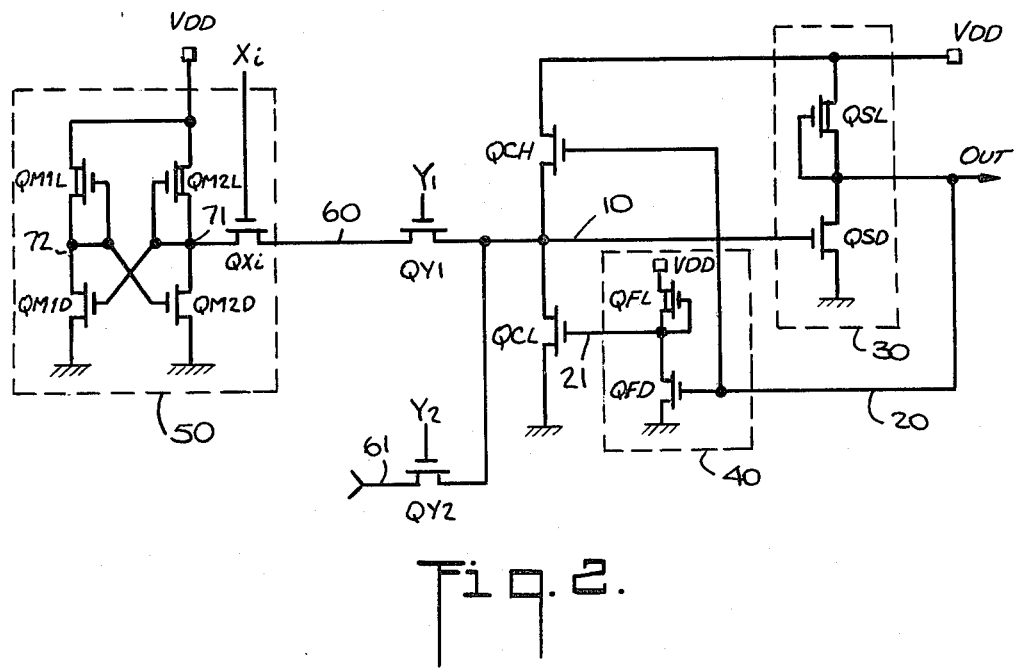
FIG. 2 shows a circuit diagram of a first embodiment according to the invention in which the invention is applied to a read-out circuit of a memory allowing the write-in and read-out.

Referring now to FIG. 2, there is shown an embodiment of a buffer circuit according to the present invention. In this embodiment, all the transistors utilized are n-channel IGFETs. In FIG. 2, a memory cell 50 includes a flip-flop having a pair of load IFGETs $Q_{M1L}$ and $Q_{M2L}$ of the depletion type and another pair of drive IGFETs $Q_{M1D}$ and $Q_{M2D}$ of the enhancement type, and a gate IGFET $Q_{Xi}$ of the enhancement type the drain of which is connected to one cross-coupled node 71 of the flip-flop, the source of which is connected to a bit line 60, and the gate of which is coupled to an X-select signal Xi. The select signal Xi is a one decode output from an X address decoder (not shown).

The bit line 60 is adapted to be coupled with another memory cell (not shown) like memory cell 50 but belonging to another X column other than the Xi column. The sense node 10 is coupled to a bit line 61 connected to memory cells of the respective X rows of a column Y2, through a gate IGFET QY2 of the enhancement type which receives at the gate another Y-select signal Y2. In this embodiment, the X-select operation is made by the gate IGFET $Q_{Xi}$ associated with the cell while the selection of Y is made by the gate IGFET QY1, QY2. The sense node 10 is connected to the gate of the drive IGFET $Q_{SD}$ of the enhancement type in a sense amplifier 30. The sense amplifier 30 is comprised of a depletion IGFET $Q_{SL}$ as a load element and the IGFET $Q_{SD}$ connected in series between a power source $V_{DD}$ and ground. The output OUT of the sense amplifier 30 is derived from a connecting point between the IGFETs $Q_{SL}$ and $Q_{SD}$. The output OUT is connected to the gate of a first control IGFET QCH of the enhancement type the drain of which is connected to the power source $V_{DD}$ and the source of which is connected to the sense node 10. The output OUT is further connected to a gate of an enhancement IGFET $Q_{FD}$ of a feedback circuit 40 including a depletion type IGFET $Q_{FL}$ and the IGFET $Q_{FD}$ and constructed in inverter fashion. The output of the feedback circuit 40 is connected to the gate of a second control IGFET $Q_{CL}$ of the enhancement type the drain of which is connected to the sense node 10 and the source of which is connected to ground potential.

In operation, assume first that a logical "1" (high level) stored in the memory cell 50 is read out. At this time, the node 71 in the memory cell 50 is at high level while a node 72 is at a low level. The high level at the node 71 is supplied to the sense node 10 by way of the X-select IGFET $Q_{Xi}$ and the Y-select IGFET QY1. The potential at the sense node 10 renders the output OUT of the sense amplifier 30 low level. Through the line 20 and the feedback circuit 40, the gate potential of the first control IGFET QCH is accordingly rendered low level while the gate potential of the second control IGFET QCL is rendered high level. The conducting IGFET QCL prevents the potential at the sense node 10 from rising above a level necessary for the output level of the sense amplifier 30 to be at low level. The level at the sense node 10 is determined depending on the ratio of the current ability (conductance) of the IGFET $Q_{CL}$ to that of the IGFET $Q_{SD}$. When a logical "0" (low level) is read out of memory, the inverse of the above case takes place. Accordingly, the gate potential of the first control IGFET QCH becomes high level while the gate level of the second control IGFET QCL becomes low level. As a result, IGFET $Q_{CH}$ becomes conductive and the potential at the sense node 10 can be prevented from dropping below a level necessary for the output level of the sense amplifier 30 to have a high level. In this manner, the level at the node 10 is maintained in accordance with the ratio of the current ability (conductance) of the IGFET $Q_{CH}$ to that of the IGFET $Q_{SD}$.

An explanation will be given now of the case where, after "1" is read out onto the sense node, a memory cell storing "0" is selected by switching a Y-select signal or an X-select signal, and hence the potential at the sense node 10 changes. The potential at the sense node 10 is discharged through the Y-select IGFET QY1, and through the X-select IGFET QXi and the IGFET QM2D which are associated with the selected memory cell. At this time, the second control IGFET QCL has been conductive and the potential at the sense node 10 has been prevented from rising above a given potential. Therefore, the initial potential at the sense node 10 is lower than that in the case where the second control IGFET QCL is not used. Further, the second control IGFET QCL, together with the IGFET QM2D in the selected memory cell, serves as a dicharge path. Consequently, the sense node 10 can be rapidly discharged.

Another case will now be considered where, after "0" is read-out onto the sense node 10, a memory cell storing "1" is selected and therefore the sense node potential changes. In this case, an inverse operation to that of the former case is performed. The first control IGFET QCH prevents the initial potential at the sense node 10 from falling below a given potential. The first control IGFET QCH as well as the IGFET QM2L in the selected memory cell serves as a charging path. Consequently, the sense node 10 can again be rapidly charged. The current abilities of the respective IGFETs used in this embodiment will be tabulated in table I, each with designations of W for the channel width and L for the channel length.

TABLE I

| IGFET | W (um) | L (um) |
|---|---|---|
| QCH | 10 | 5 |
| QCL | 10 | 5 |
| QSL | 15 | 5 |
| QSD | 70 | 5 |
| QFL | 7 | 10 |
| QFD | 20 | 5 |

Using devices having these parameters, when $V_{DD}$ is 5 V, the logical amplitude at the sense node 10 swings between ±0.5 V with respect to 1 V, i.e. ranges in change from 0.5 to 1.5 V. Thus, a high speed read-out operation of 140 ns access time is realized.

Figure 3:
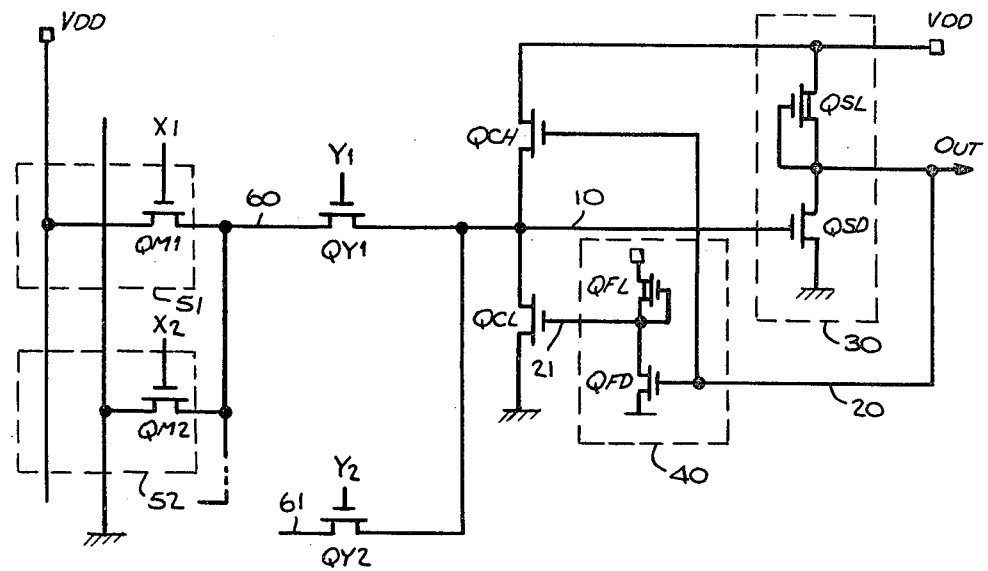
FIG. 3 shows a circuit diagram of a second embodiment according to the invention in which the invention is applied to a sense circuit of a read-only memory.

A second embodiment of the invention will be given with reference to FIG. 3. In this embodiment, the invention is applied to a sense circuit for a read only memory (ROM). The ROM used here is constructed such that it produces a potential corresponding to a logic level to be read out, through a gate. A memory cell 51 from which a logical "1" is read out is comprised of an enhancement IGFET $Q_{M1}$ the source of which is connected to a bit line 60, the drain of which is connected to the power source $V_{DD}$, and the gate of which is coupled to receive an X-select signal X1. A memory cell 52 from which a logical "0" is to be read out is comprised of an enhancement IGFET $Q_{M2}$ the drain of which is connected to ground, the source of which is connected to a bit line, and the gate of which is coupled to receive an X-select signal X2. This type memory cell does not need a load element. Therefore, there is no need for consideration of the time required for charging the cell through the load element and hence, it is accessible at a high speed. As in the case of the first embodiment, the sense node 10 is selectively coupled with the bit line 60 or 61 through a Y-select IGFET QY1 or QY2. The remaining circuit components such as a sense amplifier and a feedback circuit as denoted 20 to 40 are the same as those in the first embodiment.

The operation of the second embodiment is similar to that of the first embodiment. For example, when the memory cell 51 storing "1" is selected, the second control IGFET QCL conducts to prevent the potential at the sense node 10 from rising above a given potential. Conversely, when the memory cell 52 storing "0" is selected, the IGFET QM2 of the memory cell 52 provides a path permitting the sense node 10 to discharge therethrough. At this time, the second control IGFET QCL also provides a discharge path. For this reason, the discharging time is shortened. When the memory cell 52 storing "0" is selected, the conduction of the first control IGFET QCH prevents the potential at the sense node 10 from falling below the given potential. Then, when selection shifts to the memory cell 51 storing "1", at the instant that the IGFET QM1 in the memory cell 51 charges the sense node 10 the first control IGFET QCH also serves as a charging path. In this way, the charging time is shortened.

Figure 4:
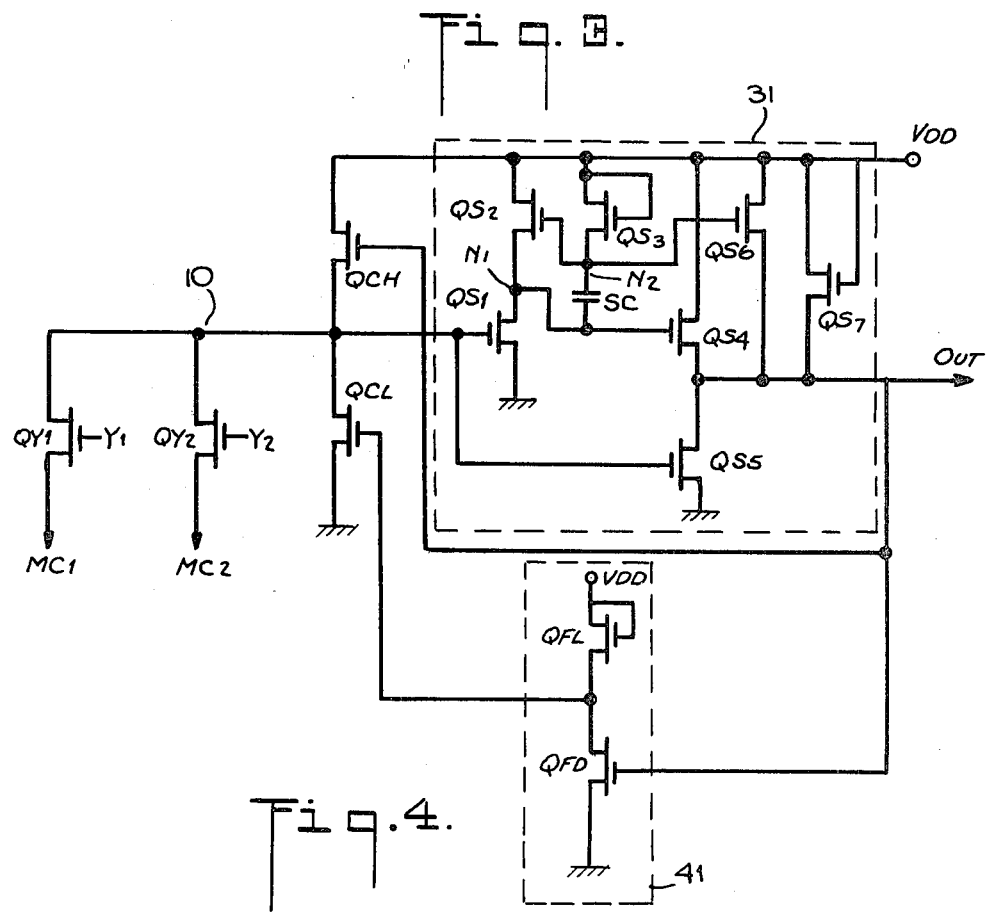
FIG. 4 shows a circuit diagram of a third embodiment according to the invention.

Turning now to FIG. 4, there is shown a third embodiment according to the present invention. A major difference of the third embodiment different from the embodiment shown in FIG. 2 resides in an amplifier circuit 31. The amplifier circuit 31 includes enhancement type IGFETs QS1 to QS7 and a bootstrap capacitor SC. The IGFETs QS1 to QS3 and the capacitor SC form a bootstrap circuit. The IGFET QS6, in the subcircuit comprised of the IGFETs QS4 to QS6 is operated in a non-saturated region, and consequently a power source $V_{DD}$ level can be produced through the output OUT when the input level is low. The operation of the embodiment is essentially the same as in the case of the preceeding embodiment.

Figure 5:
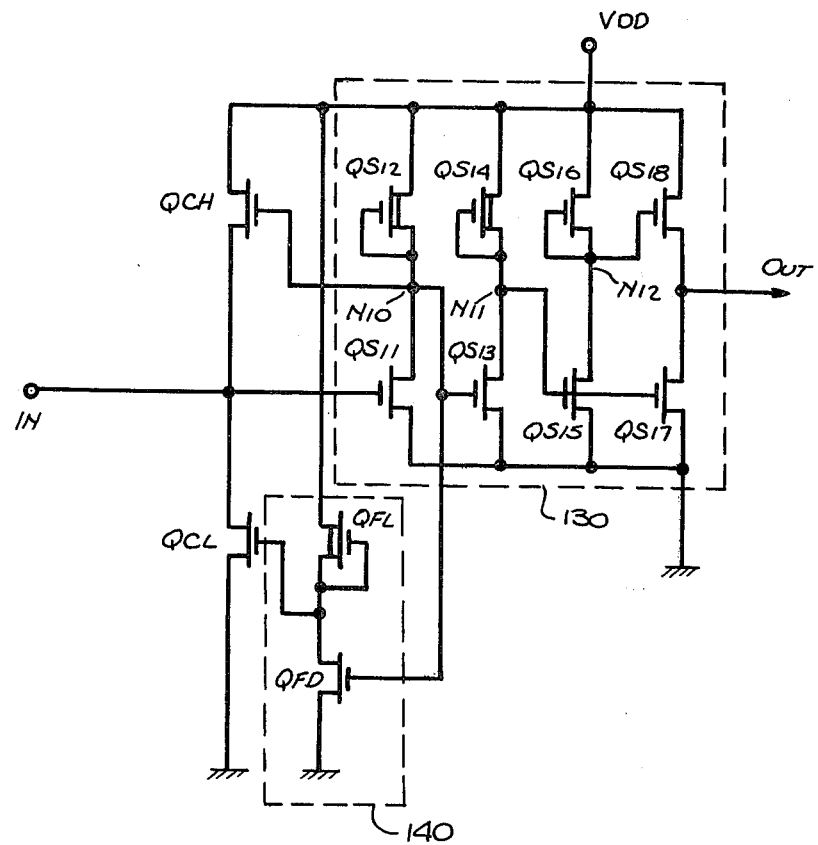
FIG. 5 shows a circuit diagram of a fourth embodiment according to the invention.

In FIG. 5, there is shown a fifth embodiment of the invention in which the invention is applied to a general buffer circuit.

In an amplifier section 130, a depletion type load IGFET QS12 and an enhancement type IGFET QS11 form a first stage inverter. The output N10 of the first stage inverter is applied to a second stage inverter comprised of a depletion type IGFET QS14 and an enhancement type IGFET QS13. The output N11 of the second stage inverter is applied to a third stage inverter comprised of a depletion type IGFET QS16 and an enhancement type IGFET QS15, and further is applied to the gate of an IGFET QS17 of a push-pull circuit comprised of enhancement type IGFETs QS17 and QS18. The output N12 of the third stage inverter is supplied to the gate of the IGFET QS18. In this embodiment, the output N10 of the first stage inverter is fed back to complementarily control the IGFET QCH and the MOST QCL. As shown, the output N10 is applied directly to the gates of the IGFET QCH and the reverse phase of the output N10, inverted by the inverter 140, is supplied to the gate of the IGFET QCL. Thus, the amplitude of the input to the input terminal IN is restricted by the output from the first stage inverter of the amplifier circuit 130.

Although the present invention has been described on the basis of some specific embodiments, the invention is applicable for any type of buffer circuit. The control signal applied to the control transistor may be a signal taken out from the interior of the buffer circuit in place of the output of the buffer circuit which is used in the above-mentioned embodiments.

What is claimed is:

1. A buffer circuit for producing output signals of opposite phase relative to applied input signals, said buffer circuit comprising an input node; a first power source having a high potential; a second power source having a low potential; means for supplying said input node with input signals which change between high and low potential levels; a first inverter circuit including a series circuit of a load element and an input transistor, said input transistor being connected to said input node so as to perform a switching operation in response to said input signal to produce output signals of opposite phase to said input signals, said output signals being derived from an intermediate junction between said load element and said input transistor, the level of each output signal being changed opposite to each corresponding change of input signal level; a first transistor connected between said first power source and said input node; a second transistor connected between said second power source and said input node; means for connecting a gate of said first transistor to said intermediate junction; and a second inverter having an input terminal coupled to a gate of said intermediate junction and an output terminal connected to said second transistor, said first transistor being made conductive when said input signals change from a high to a low potential level and said output signal changes from a low to a high potential level thereby to shift the level of the potential at said input node toward that of said first power source without changing the phase of the level at said input node and said second transistor being made conductive when said input signals change from a low to a high potential level and said output signal changes from a high to a low potential level thereby to shift the level of the potential at said input node toward that of said second power source without changing the phase of the level of said input node.

2. The circuit according to claim 1, in which the ratio of the channel width to channel length of said input transistor is larger than those of said first and second transistors.

3. A sense circuit comprising a sense node to which an information signal stored in a selected memory cell is applied; a first power source having a high potential; a second power source having a low potential; said information signal being changeable between a first logic state of high potential level and a second logic state of low potential level; a first inverter circuit having an input terminal connected to said sense node and having an output terminal; said first inverter circuit including a load element and an input transistor connected in series between said first power source and said second power source; said input transistor being switched in response to a change in logic state potential level at said sense node thereby to produce an output signal of opposite logic state potential level to that of said sense node; a first control transistor connected between said first power source and said sense node; a second control transistor connected between said second power source and said sense node; means for connecting a control terminal of said first control transistor with said output terminal of said first inverter circuit; and a second inverter circuit having an input terminal receiving output signals from said first inverter circuit; means for supplying a control terminal of said second control transistor with output signals from said second inverter circuit, said first control transistor being made conductive when the output signal of said first inverter circuit is in said first logic state thereby to shift the potential level at said sense node in a direction towards the potential level of said first power source without changing the logic state at said sense node from said second logic state to the first logic state, said second control transistor being made conductive when the output signal of said first inverter circuit is in said second logic state thereby to shift the potential level at said sense node in a direction towards the potential level of said second power source without changing the logic state at said sense node from the first logic state to the second logic state, whereby the amplitude of the potential of said information signal at said sense node is made small.

4. The circuit according to claim 1 or 3, in which said load element is composed of a depletion type field effect transistor.

5. The circuit according to claim 3, in which the ratio of the channel width to channel length of said first control transistor is the same as that of said second control transistor.

6. The circuit according to claim 3, in which the ratio of the channel width to channel length of said input transistor is larger than those of said first and second control transistors.

7. The circuit according to claim 3, further comprising a plurality of memory cells, and a plurality of transfer gates coupling said plurality of memory cells, respectively, to said sense node.

8. A buffer circuit comprising an input node; an output node; a first power source; a second power source; a first enhancement type field effect transistor having its drain connected to said output node, its gate connected to said input node, and its source connected to said second power source; a first depletion type field effect transistor having its drain connected to said first power source, its gate connected to said output node and its source connected to said output node; a second enhancement type field effect transistor having its gate connected to said output node, its source connected to said second power source and having a drain; a second depletion type field effect transistor having its drain connected to said first power source and having its gate and source commonly connected to the drain of said second enhancement type field effect transistor; a third enhancement type field effect transistor having its drain connected to said first power source, its gate connected to said output node, and its source connected to said input node; and a fourth enhancement type field effect transistor having its drain connected to said input node, its gate connected to the drain of said second enhancement type transistor and its source connected to said second power source.

* * * * *

UNITED STATES PATENT AND TRADEMARK OFFICE
CERTIFICATE OF CORRECTION

PATENT NO. : 4,348,601
DATED : September 7, 1982
INVENTOR(S) : YOSHISHIGE KITAMURA It is certified that error appears in the above-identified patent and that said Letters Patent is hereby corrected as shown below:

Column 2, line 60, "IFGETs" to read -- IGFETs --.

Signed and Sealed this

Sixteenth Day of November 1982

[SEAL]

Attest:

GERALD J. MOSSINGHOFF

Attesting Officer    Commissioner of Patents and Trademarks

UNITED STATES PATENT AND TRADEMARK OFFICE
CERTIFICATE OF CORRECTION

PATENT NO. : 4,348,601

DATED : September 7, 1982

INVENTOR(S) : Yoshishige Kitamura

It is certified that error appears in the above-identified patent and that said Letters Patent is hereby corrected as shown below:

Title page, after item "[22] Filed: Aug. 8, 1979", insert

-- [30]  Foreign Application Priority Data
  Aug. 11, 1978 [JP] Japan ..........53-98599 --.

Signed and Sealed this

Eighth Day of March 1983

[SEAL]

Attest:

GERALD J. MOSSINGHOFF

Attesting Officer

Commissioner of Patents and Trademarks